US009048809B2

(12) United States Patent
Adkisson et al.

(10) Patent No.: US 9,048,809 B2
(45) Date of Patent: Jun. 2, 2015

(54) METHOD OF MANUFACTURING SWITCHABLE FILTERS

(75) Inventors: James W. Adkisson, Jericho, VT (US); Panglijen Candra, Williston City, VT (US); Thomas J. Dunbar, Burlington, VT (US); Jeffrey P. Gambino, Westford, VT (US); Mark D. Jaffe, Shelburne, VT (US); Anthony K. Stamper, Williston, VT (US); Randy L. Wolf, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 495 days.

(21) Appl. No.: 13/342,375

(22) Filed: Jan. 3, 2012

(65) Prior Publication Data

US 2013/0169383 A1 Jul. 4, 2013

(51) Int. Cl.
*H03H 3/08* (2006.01)
*H03H 9/05* (2006.01)
(Continued)

(52) U.S. Cl.
CPC ............... *H03H 3/08* (2013.01); *H03H 9/0542* (2013.01); *H03H 9/1064* (2013.01); *H03H 9/1092* (2013.01); *H01L 41/094* (2013.01); *H01L 41/0973* (2013.01); *Y10T 29/42* (2015.01); *Y10T 29/49005* (2015.01); *Y10T 29/49126* (2015.01);
(Continued)

(58) Field of Classification Search
CPC ..... H03H 3/08; H03H 9/0542; H03H 9/0547; H03H 9/1064; H03H 9/1092; H03H 9/6403; H01L 41/094; H01L 41/0973; Y10T 29/42; Y10T 29/49005; Y10T 29/46126; Y10T 29/49147; Y10T 29/49156
USPC ......... 29/25.35, 594, 842, 847, 830; 257/415, 257/416; 310/313 R, 313 B, 313 D, 330, 348, 310/349; 117/43
See application file for complete search history.

(56) References Cited

U.S. PATENT DOCUMENTS

| | | | |
|---|---|---|---|
| 6,703,763 B2 | 3/2004 | Tsai et al. | |
| 6,860,939 B2 * | 3/2005 | Hartzell | ............... 117/43 |

(Continued)

FOREIGN PATENT DOCUMENTS

| | | |
|---|---|---|
| CN | 101997511 | 3/2011 |
| CN | 102198924 | 9/2011 |

(Continued)

OTHER PUBLICATIONS

P. Ancey "Above IC RF MEMS and BAW filters: fact or fiction?", Bipolar/BiCMOS Circuits and Technology Meeting, 2006, Publication Year: 2006, pp. 1-5.

(Continued)

*Primary Examiner* — A. Dexter Tugbang
(74) *Attorney, Agent, or Firm* — Anthony Canale; Roberts Mlotkowski Safran & Cole, P.C.

(57) ABSTRACT

Switchable and/or tunable filters and methods of manufacture. The method of forming the filters includes forming at least one piezoelectric filter structure comprising a plurality of electrodes formed on a piezoelectric substrate. The method further includes forming a micro-electro-mechanical structure (MEMS) comprising a MEMS beam formed above the piezoelectric substrate and at a location in which, upon actuation, the MEMS beam shorts the piezoelectric filter structure by contacting at least one of the plurality of electrodes.

18 Claims, 6 Drawing Sheets

(51) Int. Cl.
*H03H 9/10* (2006.01)
*H01L 41/09* (2006.01)
*H03H 9/64* (2006.01)

(52) U.S. Cl.
CPC ...... *Y10T 29/49147* (2015.01); *Y10T 29/49156* (2015.01); *H03H 9/0547* (2013.01); *H03H 9/6403* (2013.01)

(56) References Cited

U.S. PATENT DOCUMENTS

| | | | |
|---|---|---|---|
| 6,909,344 | B2 | 6/2005 | Toncich |
| 7,098,575 | B2 | 8/2006 | Mehta |
| 7,218,188 | B2 | 5/2007 | Ma et al. |
| 7,427,797 | B2 * | 9/2008 | Ohguro et al. ............ 257/415 |
| 7,514,759 | B1 | 4/2009 | Mehta et al. |
| 7,545,017 | B2 * | 6/2009 | Lee et al. |
| 2003/0006858 | A1 | 1/2003 | Ma |
| 2009/0115553 | A1 | 5/2009 | Shin et al. |
| 2009/0174014 | A1 | 7/2009 | Kunze et al. |
| 2010/0223999 | A1 * | 9/2010 | Onoe |
| 2011/0012696 | A1 | 1/2011 | Skarp |

FOREIGN PATENT DOCUMENTS

| | | | |
|---|---|---|---|
| JP | 2008238330 A | * | 10/2008 |
| WO | 2004008635 A1 | | 1/2004 |

OTHER PUBLICATIONS

J.H. Kuypers et al. "Phase Velocity Control of Surface Acoustic Waves Based on Surface Shorting and Electrical Field Application Using MEMS Switches", Ultrasonics Symposium, 2007, IEEE, Publication Year: 2007, pp. 1233-1238.

W. Pang et al. "Electrically tunable and switchable film bulk acoustic resonator", Frequency Control Symposium and Exposition, 2004. Proceedings of the 2004 IEEE International; Publication Year: 2004, pp. 22-26.

M. Miyashita et al. "A surface acoustic wave dynamics control device by grating structure", Micro Electro Mechanical Systems, 2008. MEMS 2008. IEEE 21st International Conference on; Publication Year: 2008, pp. 661-664.

J.L. Pornin et al. "Wafer Level Thin Film Encapsulation for BAW RF MEMS", Electronic Components and Technology Conference, 2007. ECTC '07. Proceedings. 57th; Publication Year: 2007, pp. 605-609, Digital Object Identifier: 10.1109/ECTC.2007.373858.

J. Petsinger et al. "Tunable Inductor and Thin Film Resonator Filter with Adjustable Bandwidth", Motorola TDB; Nov. 18, 2002, 4 pages.

J. Lim et al. "An Ultra Small SAW RF Filter Using Wafer Level Packaging Technology", Samsung Advanced Institute of Technology, Korea, 2006 IEEE Ultrasonics Symposium, pp. 196-199.

* cited by examiner

METHOD OF MANUFACTURING SWITCHABLE FILTERS

FIELD OF THE INVENTION

The invention relates to semiconductor structures and methods of manufacture and, more particularly, to switchable and/or tunable filters, methods of manufacture and design structures.

BACKGROUND

SAW (surface acoustic wave) filters play a key role in telecommunications. For example, SAW filters are widely used as bandpass and spectrum-shaping filters in mobile and wireless applications. Other applications for SAW filters include wide area networks (WAN), wireless local area network (WLAN) communications, cordless phones, pagers and satellite communications. SAW filters are preferable to conventional LC filters as they are much smaller, cheaper and more versatile, making them ideal for telecommunication applications.

In SAW filters, electrical signals are converted to a mechanical wave in a device constructed of a piezoelectric crystal or ceramic. The wave is delayed as it propagates across the device, before being converted back to an electrical signal by other electrodes. More specifically, coupling between surface waves and electrical signals is achieved by interdigital transducers (IDTs). A simple form of the IDT consists of parallel fingers alternately connected to opposite electrodes to which the signal is applied.

For example, when an AC voltage is applied to input transducers, due to piezoelectricity, the transducer produces mechanical deformation of the piezoelectric substrate surface. This, in turn, results in a surface acoustic wave traveling on the surface of the piezoelectric substrate until reaching the output IDT, where it is transformed back to an electrical signal. When this wave reaches the output IDT, the electric field will induce a potential difference between neighboring electrodes such that the output IDT will convert the mechanical vibration into output voltages.

SAW filters can be designed to provide quite complex signal processing functions within a single package containing only a piezoelectric substrate with superimposed thin metal film input and output interdigital transducers (IDTs). SAW filters can be mass-produced using semiconductor microfabrication techniques, which enables the outstanding reproducibility of the SAW filters. However, programming or tuning of the SAW filters has been found to be difficult to achieve.

BAW (Bulk Acoustic Wave) filters are electromechanical devices, which typically operate at frequencies from around 2 GHz to around 16 GHz, and may be smaller or thinner than equivalent SAW filters. The BAW filter can be a Thin Film Bulk Acoustic Resonator (FBAR or TFBAR), which is a device consisting of a piezoelectric material sandwiched between two electrodes and acoustically isolated from the surrounding medium. FBAR devices using piezoelectric films can be used as radio frequency (RF) filters for use in cell phones and other wireless applications. FBARs can also be used in a variety of other applications such as microwave oscillators and sensor applications.

FBARs utilize the acoustic resonant characteristics of piezoelectric materials, much like SAW filters, to remove unwanted frequencies from being transmitted in a device, while allowing other specific frequencies to be received and transmitted. To adjust the acoustic resonant characteristics of the FBAR, thickness of the piezoelectric film can be adjusted. Alternatively or in addition, the FBAR can be put under a mechanical load so that its resonance frequency can shift. This is known as a mass loading effect. The mass loading effect can be accomplished by depositing or growing a mass of film on the resonator to bring about downshifting of the resonance frequency of the FBAR. The mass loading is carried out by growing or depositing of a thin film material uniformly distributed on one electrode of the resonator, covering the active surface of the device. The thin film can be a dielectric material or a metal material, depending on the design criteria. However, much like in the SAW application, programming or tuning of the BAW filter has been found to be difficult to achieve.

Accordingly, there exists a need in the art to overcome the deficiencies and limitations described hereinabove.

SUMMARY

In a first aspect of the invention, a method comprises forming at least one piezoelectric filter structure comprising a plurality of electrodes formed on a piezoelectric substrate. The method further comprises forming a micro-electro-mechanical structure (MEMS) comprising a MEMS beam formed above the piezoelectric substrate and at a location in which, upon actuation, the MEMS beam shorts the piezoelectric filter structure by contacting at least one of the plurality of electrodes.

In another aspect of the invention, a filter comprises at least one filter comprising a plurality of electrodes formed on a piezoelectric substrate. The structure further comprises a beam structure positioned over the least one filter and structured to short the least one filter structure, upon actuation.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the switchable filter structures, which comprises the structures of the present invention. In still further embodiments, a method in a computer-aided design system is provided for generating a functional design model of the switchable filter structures. The method comprises generating a functional representation of the structural elements of the tunable filter structures.

More specifically, in embodiments, a method is provided in a computer-aided design system for generating a functional design model of a switchable filter structure. The method comprises generating a functional representation of a filter on a piezoelectric substrate. The method further comprises generating a function representation of a MEMS switch integrated with the filter on the piezoelectric substrate. The MEMS switch is operatively coupled to the filter to short the filter in an actuated position.

In an additional aspect of the invention, a method comprises determining a frequency of a filter or need to have the filter activated; and shorting the filter by actuating a MEMS beam into contact with at least one electrode of the filter, in response to the determining.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention. Unless otherwise specified herein, the drawings are not to scale.

DETAILED DESCRIPTION

The invention relates to semiconductor structures and methods of manufacture and, more particularly, to switchable and/or tunable filters, methods of manufacture and design structures. In embodiments, the switchable and/or tunable filter structures of the present invention include, for example, Surface Acoustic Wave (SAW) filters or Bulk Acoustic Wave (BAW) filters. In embodiments, the filter structures of the present invention are capable of being switchable between an "on" state and an "off" state using, for example, a Micro-Electro-Mechanical System (MEMS) structure. Alternative, in a multiple SAW filter application, the MEMS structure can tune the filter to a desired frequency by turning off certain of the SAW filters.

More specifically, the SAW filter of the present invention includes interdigitized or interleaved electrodes formed on the piezoelectric substrate. The piezoelectric material can be, for example, aluminum nitride or zinc oxide; although other piezoelectric materials are also contemplated by the present invention. In embodiments, the interleaved electrodes of the SAW filter include a ground electrode interleaved with either a Vin electrode or Vout electrode to form input and output IDTs, respectively. Depending on the selected harmonic frequencies, the input IDT and output IDT can be spaced apart from one another by various distances, or provided in a series configuration, amongst two or more SAW filter structures. The BAW filter includes a piezoelectric substrate sandwiched between an upper electrode and a lower electrode.

In embodiments, the SAW filter (or any of a multitude of SAW filters) or the BAW filter of the present invention can be turned "on" and "off" by a MEMS structure. For example, in embodiments, the MEMS structure can "short" the SAW filter by contacting the interleaved electrodes of Vin and ground, or a series short between signal electrodes of the Vin IDT and Vout IDT, depending on the configuration of the MEMS structure. The MEMS structure of the present invention can also short the interleaved electrodes of Vout and ground. The MEMS structure can further cause an ohmic or capacitive short modulation. In a series SAW filter configuration, the MEMS structure can tune the filter, by turning off selected SAW filter structures.

Advantageously, the MEMS structure will not contact the piezoelectric substrate and, hence, will not cause any damage to the piezoelectric substrate, which is a critical component of the SAW or BAW filter structure. In addition, it is possible to allow the filter of the present invention to be arranged in series for band switching/tuning. In this implementation, selected filters can be turned off by an electrical shorting in order to tune the filter. Also, the MEMS structure will not add any series resistance, nor will it decrease the effective Q of the filter (compared to using a FET switch to bypass the filter).

It should be understood by those of skill in the art that the present invention is not limited to a SAW filter and, as such, other types of filters are also contemplated by the present invention, e.g., any filter system that has multi-band power amplifier (PA) and low-noise amplifier (LNA). For example, the filter structure can be a BAW filter structure, which comprises a piezoelectric material sandwiched between two electrodes and acoustically isolated from the surrounding medium. In the BAW filter implementation, the MEMS structure can contact the upper or lower electrode of the BAW filter structure in order to short this filter. As in any of the embodiments, the MEMS structure can be expanded to a variety of voltages, heights, cantilever geometries, layouts, stiction points, etc., in order to short the filter structures (e.g., SAW or BAW filter structures). The MEMS structure can also be used in combination with a loading mass (e.g., loading bar), for example, to apply a mechanical load on the BAW filter structure, thus shifting its resonant frequency.

Figure 1:
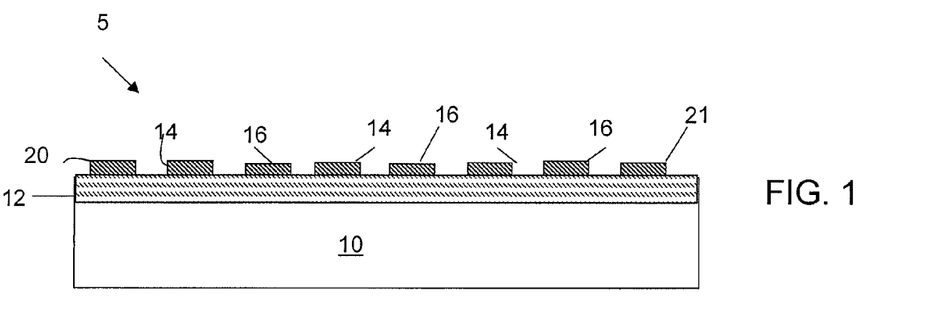
FIGS. 1-7 show fabrication processes and respective structures for fabricating a switchable filter structure in accordance with aspects of the present invention.

FIG. 1 shows a beginning structure and respective fabrication processes for fabricating a SAW filter in accordance with aspects of the present invention. More specifically, FIG. 1 shows a beginning structure 5, which includes a substrate 10. In embodiments, the substrate 10 can be any insulator material or other type of substrate. A piezoelectric substrate 12 is formed on the substrate 10. In embodiments, the piezoelectric substrate 12 can be any type of piezoelectric material such as, for example, AlN or ZnO.

As further shown in FIG. 1, a plurality of electrodes and wiring structures 14, 16, and 21 are formed on the piezoelectric substrate 12. In embodiments, the electrodes and wiring structures 14, 16, 20 and 21 can be formed by an additive or subtractive process. For example, in a subtractive process, the electrodes and wiring structures 14, 16, 20 and 21 can be formed by depositing a metal layer on the piezoelectric substrate 12, and patterning the metal layer using conventional lithographic and etching (e.g., reactive ion etching (RIE) processes. The metal layer can be any conductive metal or alloy thereof. For example, the metal layer can be, for example, aluminum, gold or copper; although other metals are contemplated by the present invention. In embodiments, the electrode 14 is a Vin electrode (signal electrode) of a Vin IDT, the electrode 16 is a ground electrode of the Vin IDT, the wiring structure 20 provides an electrical contact for a MEMS structure, and electrode 21 is an actuator for the MEMS structure. It should be understood by those of skill in the art, that the electrode 14 and the electrode 16 can be associated with a Vout IDT.

In one non-limiting example, the electrodes and wiring structures 14, 16, 20 and 21 can be deposited on the substrate 12 to a depth of about 0.05 to 4 μm and preferably to a depth of 0.25 μm; although other dimensions are also contemplated by the present invention. In embodiments, the electrodes and wiring structures 14, 16, 20 and 21 can be a refractory metal such as Ti, TiN, TiN, Ta, TaN, and W and the like, or AlCu, or a noble metal such as, for example, Au, Pt, Ru, Ir, and the like amongst other wiring materials. For example, in embodiments, the electrodes 14, 16, 20 and 21 could be formed from pure refractory metals, or aluminum or an aluminum alloy such as AlCu, AlSi, or AlCuSi.

Figure 2:
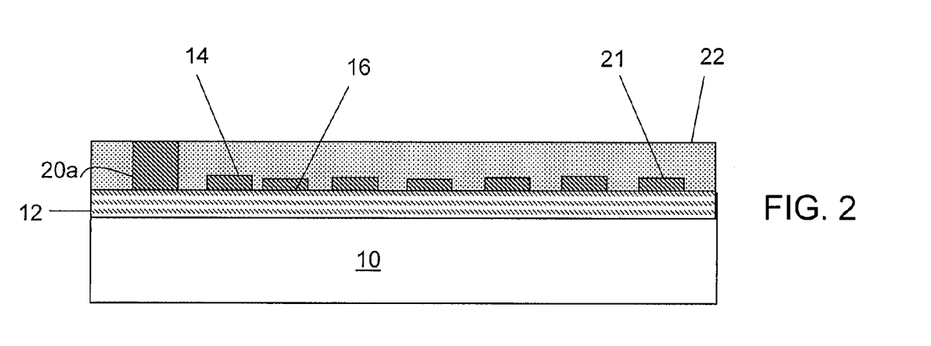

In FIG. 2, an insulator layer 22 is deposited over the electrodes and wiring structures 14, 16, 20 and 21, and exposed portions of the piezoelectric substrate 12. The insulator layer 22 can be any insulator layer such as, for example, an oxide based material ($SiO_2$) or other interlevel dielectric material known to those of skill in the art. The insulator layer 22 can be deposited using any conventional deposition process, e.g., chemical vapor deposition (CVD). For example, deposition options for the insulator layer 22 include one or more of plasma-enhanced CVD (PECVD), sub-atmospheric CVD (SACVD), atmospheric pressure CVD (APCVD), high density plasma CVD (HDPCVD), physical vapor deposition (PVD), or atomic layer deposition (ALD). In embodiments, the insulator layer 22 is deposited at temperatures compatible with metal wiring, e.g., aluminum wiring, e.g., under about 420° C. and preferably under about 400° C. In embodiments, the insulator layer 22 is deposited to a depth of about 80 nm; although other dimensions are also contemplated by the present invention.

In embodiments, the insulator layer 22 can be patterned using conventional lithographic and etching processes to form a pattern (e.g., opening). In embodiments, the opening is aligned with the electrode 20. A metal material is then deposited in the opening to form a stud contact 20a. The metal material can be any metal material compatible with the electrode 20.

Figure 3:
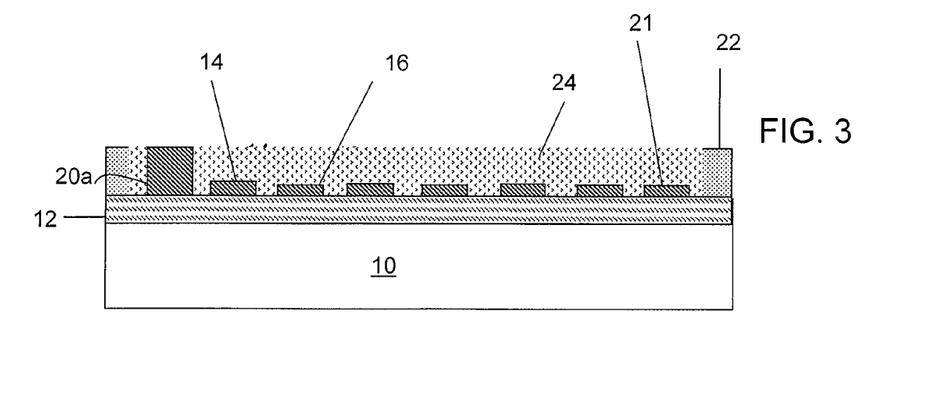

In FIG. 3, the insulator layer 22 can be patterned using any conventional lithographic and etching process. The patterning will result in an opening, exposing the electrodes 14, 16 and 21 and previously formed stud 20a. The opening is then filled with a sacrificial material 24 such as, for example, PMGI (polydimethylglutarimide polymer) or silicon. The sacrificial material 24 can be planarized to expose the stud 20a. The planarization can be performed by a chemical mechanical process (CMP), known to those of skill in the art.

Figure 4:
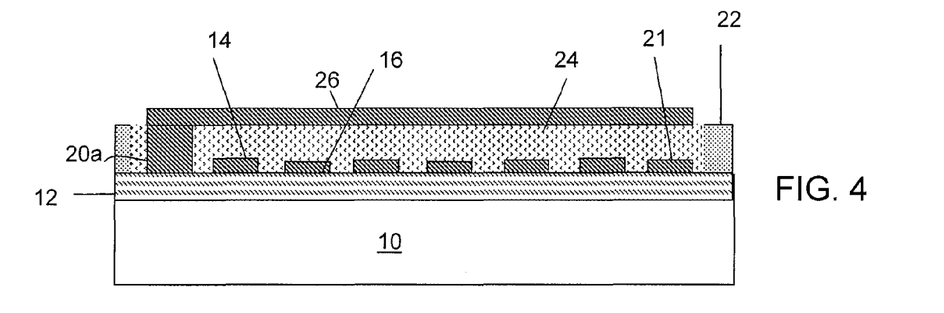

FIG. 4 shows the formation of a MEMS structure. The MEMS structure of the present invention can be manufactured in a number of ways using a number of different tools. In general, though, the methodologies and tools are used to form small structures with dimensions in the micrometer scale with dimensions of approximately 5 µm thick, 100 µm wide, and 400 µm long; although other dimensions are also contemplated by the present invention as discussed herein. Many of the methodologies, i.e., technologies, employed to manufacture MEMS are adopted from integrated circuit (IC) technology. For example, the MEMS structure can be realized in thin films of materials patterned by photolithographic processes and fixed at one end to an insulator material, and suspended within a cavity. In particular, the fabrication of the MEMS structure can implement: (i) deposition of thin films of material on a substrate (e.g., insulator layer), (ii) apply a patterned mask on top of the films by photolithographic imaging, and (iii) etch the films selectively to the mask.

More specifically, in FIG. 4, a beam structure 26 is formed on the sacrificial material 24, and in contact with the stud 20a. In embodiments, the beam structure 26 comprises a metal material, forming a portion of a MEMS structure. In embodiments, the beam structure 26 can be formed by an additive process or subtractive process. For example, in a subtractive process, a metal material is deposited on the sacrificial material 24, which is then patterned using conventional lithographic and etching (e.g., reactive ion etching (RIE)) processes. The metal can be any conductive metal or alloy thereof, e.g., aluminum, gold or copper; although other metals are contemplated by the present invention. In embodiments, the beam structure 26 can also be a composite beam structure, formed by a deposition of metal, oxide, metal or, alternative, an oxide, metal, oxide (to form an ohmic or capacitive short modulation). Alternatively, the beam structure 26 can be a metal and oxide beam, formed in a similar manner to the beams described above (e.g., deposition and etching).

Figure 5:
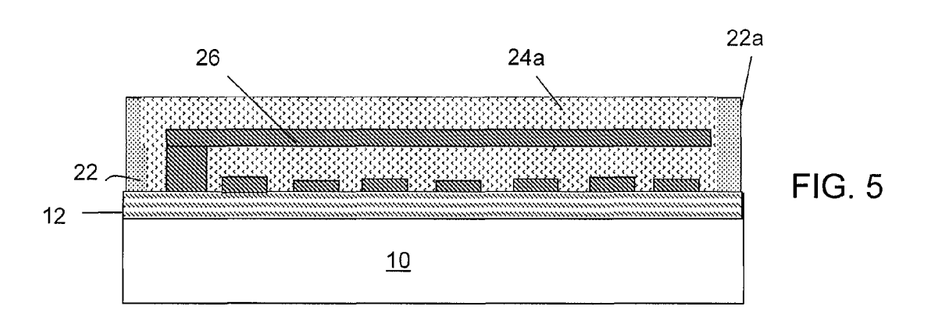

As shown in FIG. 5, an insulator layer 22a is formed on the sacrificial material 24 and over the beam structure 26. In embodiments, the insulator layer 22a can be any insulator layer as described with reference to layer 22. The insulator layer 22a is then patterned to form an opening, using any conventional lithographic and etching process known to those of skill in the art. The patterning will result in an opening, exposing the beam structure 26. The opening is then filled with a sacrificial material 24a such as, for example, PMGI or silicon. In alternate embodiments, the sacrificial material 24a can be formed and patterned, without the use of the insulator layer 18a.

Figure 6:
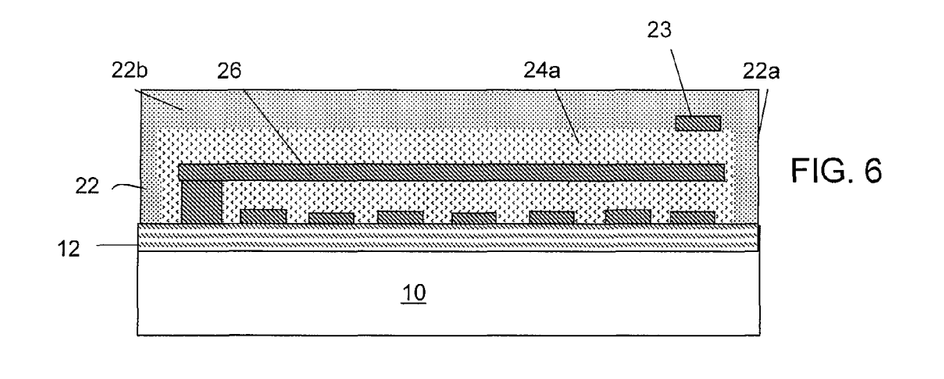

In FIG. 6, a second actuator 23 is formed above the beam structure 26. The second actuator 23 can be formed by any conventional process, using any conventional metal or metal alloys as already discussed herein. For example, in embodiments, an insulator layer 22b can be formed (e.g., deposited) on the sacrificial material 24a, and patterned using conventional lithographic and etching processes. Metal can then be deposited in the pattern (e.g., opening) to form the second actuator 23. Additional insulator material (e.g., capping layer) 22b can then be deposited on the second actuator 23.

Figure 7:
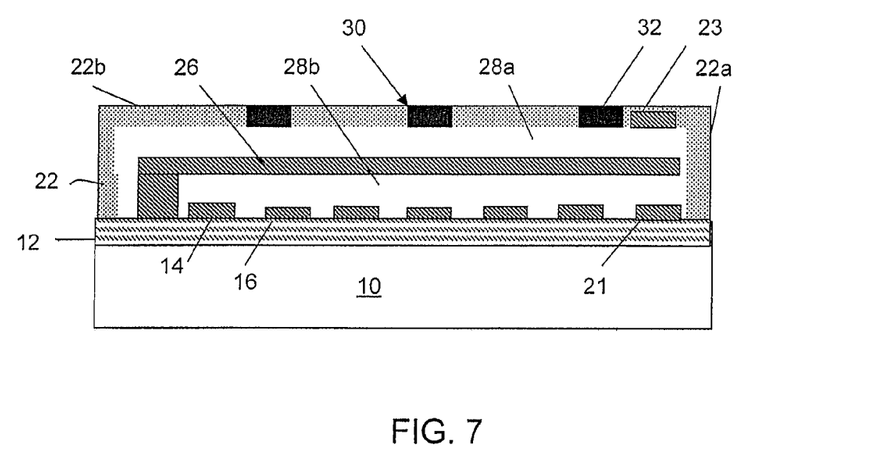

In FIG. 7, one or more vent holes 30 are patterned and opened in the insulator layer 22b, exposing a portion of the sacrificial material 24a. The vent hole 30 can be formed using conventional lithographic and etching processes known to those of skill in the art. The width and height of the vent hole 30 determines the amount of material that should be deposited after venting to pinch off the vent hole 30. The vent hole 30 may be circular or nearly circular to minimize the amount of subsequent material needed to pinch it off.

In FIG. 7, the sacrificial material is vented or stripped by way of the vent hole 30. In embodiments, the stripping (e.g., etching) can be performed using an etchant that is selective to removing of the sacrificial material through the vent hole 30, e.g., $XeF_2$. The etching will strip all of the sacrificial material, thereby forming an upper cavity or chamber 28a and a lower cavity or chamber 28b. The vent hole 30 can then be sealed with material 32, such as a dielectric or metal. To avoid an issue of sealing material entering the cavity and depositing on the MEMS structure, in embodiments, the vent holes 30 can be strategically placed away from the MEMS structure (e.g., beam structure 26), so that no vent hole sealing material is deposited on the released beam.

Figure 8:
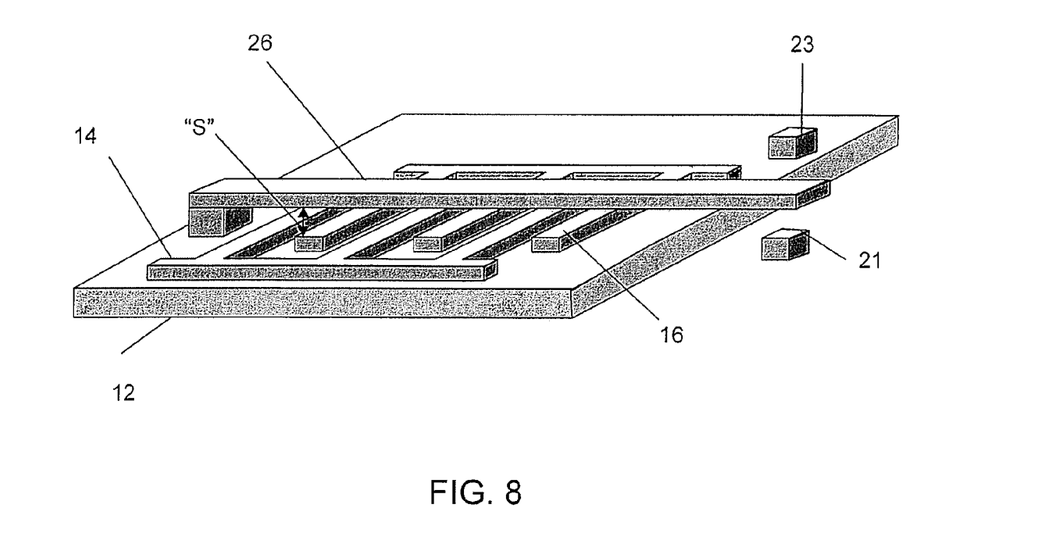
FIG. 8 shows a perspective exploded view of the switchable filter of FIG. 7, in accordance with aspects of the present invention.

FIG. 8 shows a perspective exploded view (without the insulator material shown) of the filter structure in accordance with aspects of the present invention. As shown in FIG. 8, the beam structure 26 is a monolithic, cantilever beam structure (e.g., single cantilever beam structure) which extends over the interleaved electrodes 14, 16 and is positioned between the actuators 21 and 23. As shown in this view, the beam structure 26 is rectangular in shape; although other shapes are also contemplated by the present invention, and is positioned perpendicular to the filter (e.g., interleaved electrodes 14, 16) for less parasitic capacitance. A space "S" between the beam structure 26 and the interleaved electrodes 14, 16 (and the actuators 21 and/or 23) can range from 0.1 to 5 µm depending on the design criteria. It should be understood that adjustment to the space, as well as the pull down voltage of the beam structure 26 can be provided by the present invention.

In FIG. 8, the beam structure 26 is in a non-actuated state (i.e., space between the beam structure 26 and interleaved electrodes 14, 16). In this non-actuated state, the beam structure 26 does not "short" the electrodes 14, 16 and, hence will not turn "off" the SAW filter. However, upon an application of voltage, the beam structure 26 will be pulled into contact with the interleaved electrodes 14, 16, providing an electrical short and hence turning "off" the SAW filter. The application of voltage can be provided by, for example, the actuator 21 (attractive force (voltage positive)) or the actuator 23 (repulsive force (negative voltage)). It should be understood that this same configuration and shorting design can be used for either the Vin IDT or Vout IDT.

Figure 9:
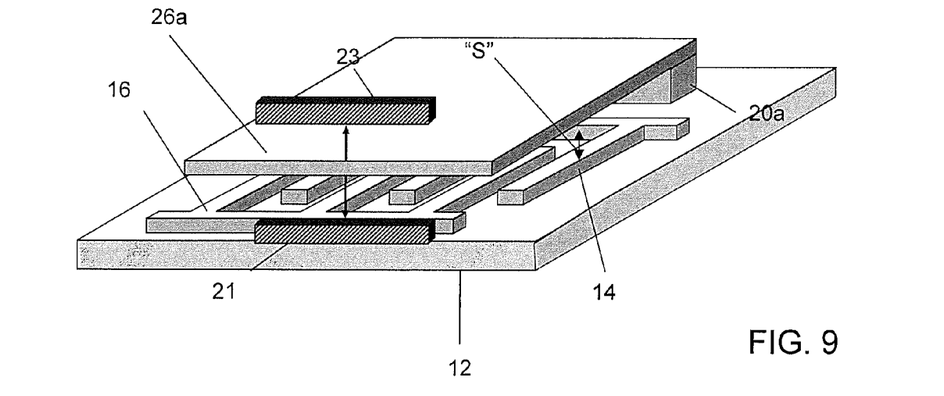
FIG. 9 shows a perspective exploded view of a switchable filter in accordance with additional aspects of the present invention.

FIG. 9 shows a perspective exploded view (without the insulator material shown) of an alternative filter structure in accordance with aspects of the present invention. As shown in FIG. 9, the beam structure 26a is a monolithic, cantilever beam structure (e.g., single cantilever beam structure) extending over substantially the entire surface area of the interleaved electrodes 14, 16. The beam structure 26a is also positioned between the actuators 21 and 23. As shown in this view, the beam structure 26a is rectangular in shape and is positioned in a different orientation than the beam structure 26 of FIG. 8; although other shapes and orientations are also contemplated by the present invention. More specifically, the beam structure 26a is rotated 90 degrees with respect to the beam structure 26 of FIG. 8. A space "S" between the beam structure 26 and the interleaved electrodes 14, 16 (and the actuators 21 and/or 23) can range from 0.1 to 5 μm depending on the design criteria. It should be understood that adjustment to the space, as well as the pull down voltage of the beam structure 26a can thus be provided by the present invention.

In FIG. 9, the beam structure 26a is in a non-actuated state (i.e., space between the beam structure 26a and interleaved electrodes 14, 16). In this non-actuated state, the beam structure 26a does not "short" the electrodes 14, 16 and, hence, will not turn "off" the SAW filter. However, upon an application of voltage, the beam structure 26 would be pulled into contact with the interleaved electrodes 14, 16, providing an electrical short and hence turning "off" the SAW filter. The application of voltage can be provided by, for example, the actuator 21 (attractive force (voltage positive)) or the actuator 23 (repulsive force (negative voltage)). In alternative embodiments, the ground electrode 16 can act as a pull down actuator, thus eliminating the processing steps required for fabricating the actuators 21, 23. It should be understood that this same configuration and shorting design can be used for either Vin IDT or Vout IDT.

Figure 10:
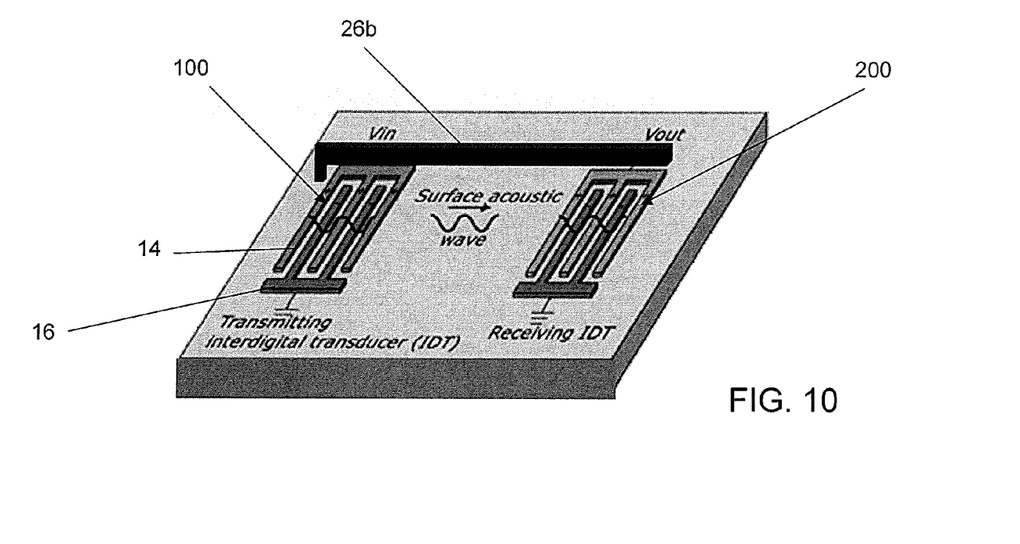
FIG. 10 shows a perspective view of a switchable filter in accordance with additional aspects of the present invention.

FIG. 10 shows a perspective view of an alternate filter structure in accordance with additional aspects of the present invention. More specifically, FIG. 10 shows the interleaved electrodes 14, 16 for a Vin IDT 100 and Vout IDT 200. In this embodiment, the beam structure 26b of the present invention is fabricated to extend between the Vin IDT 100 and Vout IDT 200, and more specifically between the non-grounded electrodes 14 for the Vin IDT 100 and Vout IDT 200. In embodiments, the beam structure 26b is fabricated using the processes as described above, but extending between the Vin IDT 100 and Vout IDT 200.

In FIG. 10, the beam structure 26b is in a non-actuated state (i.e., a space is between the beam structure 26 and electrodes 14 of the Vin IDT 100 and Vout IDT 200). In this non-actuated state, the beam structure 26b does not "short" the electrodes 14 and, hence will not turn "off" the SAW filter. However, upon an application of voltage, the beam structure 26b would be pulled into contact with the interleaved electrodes 14 of the Vin IDT 100 and Vout IDT 200. In this way, the bias condition of Vin IDT 100 and Vout IDT 200 are the same thus turning "off" the SAW filter structure of the present invention. As in the previous embodiments, the application of voltage can be provided by, for example, the actuator 21 (attractive force (voltage positive)) or the actuator 23 (repulsive force (negative voltage)). In alternative embodiments, one of the ground electrodes 16 can act as an actuator, thus eliminating the processing steps required for fabricating the actuators 21, 23.

Figure 11:
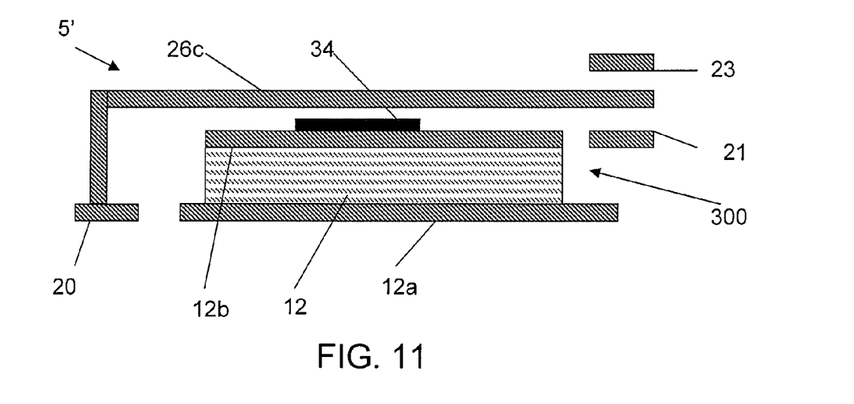
FIG. 11 shows fabrication processes and an alternate switchable filter structure in accordance with additional aspects of the present invention.

FIG. 11 shows a cut-away view of an alternate filter structure in accordance with aspects of the present invention. More specifically, FIG. 11 shows a BAW filter structure 5' with a MEMS beam structure 26c. In embodiments, the BAW filter structure 5' includes a piezoelectric substrate 12 sandwiched between a lower electrode 12a and an upper electrode 12b. In embodiments, BAW filter structure 5' can be manufactured using conventional CMOS fabrication processes, e.g., deposition of the lower electrode 12a, piezoelectric substrate 12 and upper electrode 12b, and patterning thereof. In embodiments, the MEMS beam structure 26c is fabricated using the same processes as described above, e.g., deposition of sacrificial material above and below the MEMS beam structure 26d using conventional deposition and patterning processes, followed by a venting process. The lower actuator 21 can be formed during the formation of the upper electrode 12b; whereas, the upper actuator 23 can be formed in a separate deposition and patterning process, e.g., using either an additive or subtractive process. In embodiments, an optional loading bar 34 can be formed on the upper electrode 12b using conventional deposition and patterning processes. In embodiments, the loading bar 34 can be a metal or oxide material. In embodiments, the loading bar 34 can act as a lower actuator for the MEMS beam 26b, thereby eliminating the need for the fabrication processes of the lower actuator 21.

It should be understood by those of skill in the art that the MEMS beam 26 can be formed under or over the BAW filter. For example, when the MEMS beam 26 is formed under the BAW filter, upon actuation, it will contact the lower electrode 12a. On the other hand, when the MEMS beam 26 is formed over the BAW filter, upon actuation, it will contact the upper electrode 12b. In either scenario, the MEMS beam 26, upon actuation, will short the BAW filter, thus placing it in an "off" state.

Figure 12:
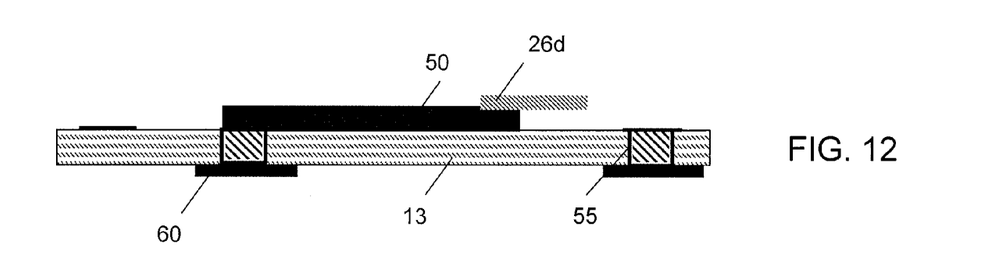
FIGS. 12-14 show fabrication processes and respective structures in accordance with additional aspects of the present invention.
Figure 13:
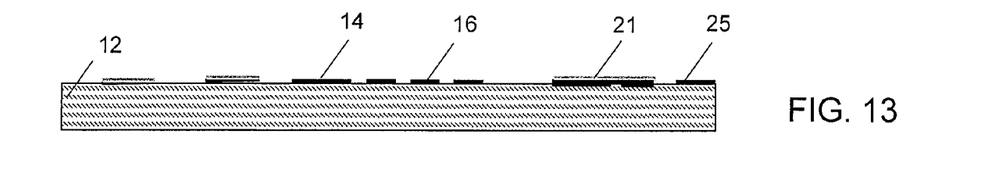
Figure 14:
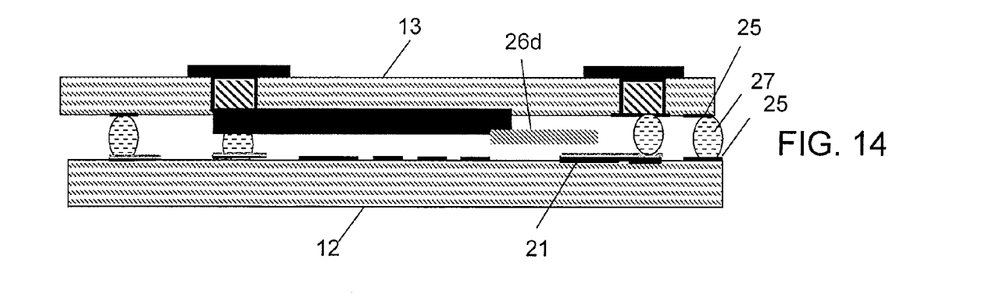

FIGS. 12-14 show fabrication processes and respective structures for fabricating a switchable filter structure in accordance with additional aspects of the present invention. More specifically, FIGS. 12-14 represent a bonding process to form a SAW filter structure in accordance with aspects of the present invention. In FIG. 12, for example, a MEMS beam structure 26d is formed on a piezoelectric substrate 13. The MEMS beam structure 26d is formed by, for example, forming a sacrificial material below the MEMS beam structure 26d, and then forming the MEMS beam structure 26d thereon. In embodiments, the MEMS beam structure 26d can be a metal beam or a composite beam of metal and oxide or metal, oxide and metal, as already described herein. After formation of the MEMS beam structure 26d, the sacrificial material can be removed using a conventional etching process.

The MEMS beam structure 26d can be formed on a metal wiring layer 50, formed on the piezoelectric substrate 13. The metal wiring layer 50 can be formed by conventional CMOS processes, e.g., either an additive or subtractive metallization process. In embodiments, the metal wiring layer 50 is in contact with a backside metal layer 60, by a through stud 55. The through stud 55 can be formed by etching a trench into the piezoelectric substrate 13, and then filling the trench with a metal or metal alloy. In embodiments, the through stud 55 can be copper formed by e.g., electroplating copper on a seed layer. After the deposition process, the backside of the piezoelectric substrate 13 can be subject to a conventional mechanical grinding process to thin the substrate 13 and expose the through stud 55. The backside metal layer 60 can then be formed in contact with the through stud 55 using conventional deposition and patterning processes as already described herein. The backside metal layer 60 can be, for example, a copper or nickel pad; although other metals are contemplated by the present invention.

FIG. 13 shows an additional structure and respective processing steps of the SAW filter structure in accordance with aspects of the present invention. More specifically, FIG. 13 shows the formation of wiring layers on the piezoelectric substrate 12, to form the electrodes 14, 16, contacts 25 and a lower actuator (stationary electrode) 21. The electrodes 14, 16, contacts 25 and lower actuator 21 can be formed in the manner discussed above, e.g., deposition and patterning of metal.

FIG. 14 shows the bonding of the structures shown in FIGS. 12 and 13. More specifically, the piezoelectric substrates 12, 13 can be attached using, for example, a gold tin (AuSn) solder 27. In embodiments, the AuSn solder 27 can be formed on opposing contacts 25.

It should thus be understood by those of skill in the art, that the present invention is directed to a SAW filter structure or BAW filter structure formed on a substrate, e.g., piezoelectric substrate. A MEMS structure (e.g., switch) is integrated with the filter on (e.g., over) the piezoelectric substrate. The MEMS switch is operatively coupled to the filter to control routing of an input signal to the filter (e.g., in a first state, the MEMS beam is pulled down so an input signal to the filter shorts to the MEMS beam (i.e. does not go through the filter). In a second state, the MEMS beam is in its natural state, e.g., up, so the input signal propagates through the filter to a Vout IDT. According to embodiments, the MEMS beam can also be physically coupled to the signal electrodes of the Vin IDT and Vout IDT. Also, when the beam is in the down position, the beam does not make contact with the surface piezoelectric substrate, thereby eliminating any possibility of damage to the piezoelectric substrate.

In operation, it is possible to determine a frequency of a filter, e.g., SAW filter, and based on the frequency or the need to have the filter activated, short the filter by actuating the MEMS beam into contact with at least one electrode of the filter.

Figure 15:
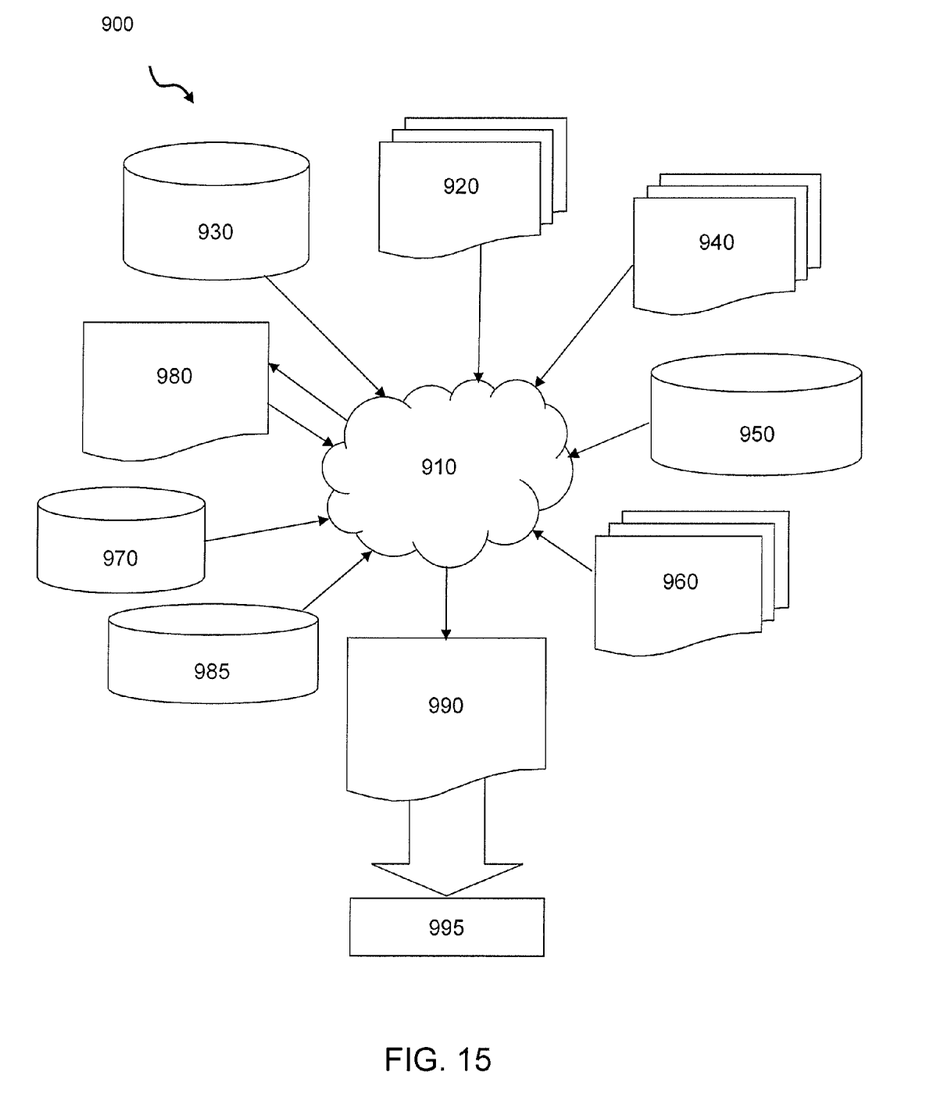
FIG. 15 is a flow diagram of a design process used in semiconductor design, manufacture, and/or test.

FIG. 15 is a flow diagram of a design process used in semiconductor design, manufacture, and/or test. FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    forming at least one piezoelectric filter structure comprising a plurality of electrodes formed on a piezoelectric substrate;
    forming a micro-electro-mechanical structure (MEMS) comprising a MEMS beam formed above the piezoelectric substrate and at a location in which, upon actuation, the MEMS beam shorts the piezoelectric filter structure by contacting at least one of the plurality of electrodes;
    forming a bottom actuator on the piezoelectric substrate, below the MEMS beam; and
    forming a top actuator on an insulator layer, above the MEMS beam.

2. The method of claim 1, wherein the at least one piezoelectric filter structure is a surface acoustic wave (SAW) filter.

3. The method of claim 2, wherein forming the SAW filter comprises:
    forming a Vin interdigital transducer (IDT) comprising interleaved signal and ground electrodes on a surface of the piezoelectric substrate; and
    forming a Vout IDT comprising interleaved signal and ground electrodes on the surface of the piezoelectric substrate.

4. The method of claim 3, wherein forming the MEMS beam comprises positioning the MEMS beam to short the interleaved signal and ground electrodes of the Vin IDT or Vout IDT, upon actuation.

5. The method of claim 3, wherein forming the MEMS beam comprises positioning the MEMS beam above respective ground electrodes of the Vin IDT and the Vout IDT.

6. The method of claim 3, wherein the ground electrode of the Vin IDT is formed as a pull in actuator for the MEMS beam.

7. The method of claim 1, wherein the piezoelectric filter structure is a bulk acoustic wave (BAW) filter.

8. The method of claim 1, wherein forming the MEMS beam comprises depositing and patterning a metal material on a sacrificial material, formed over the plurality of electrodes.

9. The method of claim 1, wherein forming of the MEMS beam is a composite beam structure formed by depositing and patterning metal and insulator material over a sacrificial material, formed over the plurality of electrodes.

10. The method of claim 1, wherein the MEMS beam is formed as a cantilever beam, positioned between actuators and perpendicular to interleaved electrodes of the at least one piezoelectric filter structure.

11. The method of claim 1, wherein the MEMS beam covers substantially an entire area of the electrodes of the at least one piezoelectric filter structure.

12. The method of claim 11, wherein a ground electrode of the electrodes is formed as a pull in actuator of the MEMS beam.

13. The method of claim 1, wherein the top actuator and the bottom actuator are positioned beyond an outmost of the plurality of electrodes.

14. The method of claim 1, wherein the top actuator and the bottom actuator are formed spaced apart from the MEMS beam in an unactuated state.

15. The method of claim 1, wherein forming the MEMS beam comprises:
    forming an insulator layer over interleaved electrodes of the least one piezoelectric filter structure;
    patterning the insulator layer to expose the interleaved electrodes;
    depositing a sacrificial material in the pattern of the insulator layer and over the interleaved electrodes;
    forming a beam structure on the sacrificial material, which is positioned over the interleaved electrodes of the least one piezoelectric filter structure;
    forming a second insulator layer on the beam structure, and patterning the second insulator layer to expose surfaces of the beam structure;
    forming additional sacrificial material in the pattern of the second insulator layer and over the beam structure;
    forming a capping layer over the additional sacrificial material;
    forming at least one vent hole in the capping layer;
    venting the sacrificial material and the additional sacrificial material through the at least one vent hole to form an upper cavity and a lower cavity about the beam structure; and
    closing the at least one vent hole with material.

16. The method of claim 1, wherein forming the MEMS beam comprises:
    forming electrodes on a first piezoelectric substrate, wherein one of the electrodes is structured as an actuator of the MEMS beam;
    forming a wiring layer on a second piezoelectric substrate;
    forming a sacrificial material on the second piezoelectric substrate;
    forming a beam structure on the sacrificial material and in contact with the wiring layer;
    removing the sacrificial material to form a space between the beam structure and the second piezoelectric substrate; and
    bonding the first piezoelectric substrate to the second piezoelectric substrate by a solder material such that a space is provided between the beam structure and the first piezoelectric substrate,
    wherein the actuator of the MEMS beam is aligned with the beam structure.

17. A method comprising:
    forming at least one piezoelectric filter structure comprising a plurality of electrodes formed on a piezoelectric substrate; and
    forming a micro-electro-mechanical structure (MEMS) comprising a MEMS beam formed above the piezoelectric substrate and at a location in which, upon actuation, the MEMS beam shorts the piezoelectric filter structure by contacting at least one of the plurality of electrodes, wherein forming the MEMS beam comprises:
    forming an insulator layer over interleaved electrodes of the least one piezoelectric filter structure;
    patterning the insulator layer to expose the interleaved electrodes;
    depositing a sacrificial material in the pattern of the insulator layer and over the interleaved electrodes;
    forming a beam structure on the sacrificial material, which is positioned over the interleaved electrodes of the least one piezoelectric filter structure;
    forming a second insulator layer on the beam structure, and patterning the second insulator layer to expose surfaces of the beam structure;
    forming additional sacrificial material in the pattern of the second insulator layer and over the beam structure;
    forming a capping layer over the additional sacrificial material;
    forming at least one vent hole in the capping layer;
    venting the sacrificial material and the additional sacrificial material through the at least one vent hole to form an upper cavity and a lower cavity about the beam structure; and
    closing the at least one vent hole with material.

18. A method comprising:
    forming at least one piezoelectric filter structure comprising a plurality of electrodes formed on a piezoelectric substrate; and
    forming a micro-electro-mechanical structure (MEMS) comprising a MEMS beam formed above the piezoelectric substrate and at a location in which, upon actuation, the MEMS beam shorts the piezoelectric filter structure by contacting at least one of the plurality of electrodes, wherein forming the MEMS beam comprises:
    forming electrodes on a first piezoelectric substrate, wherein one of the electrodes is structured as an actuator of the MEMS beam;
    forming a wiring layer on a second piezoelectric substrate;
    forming a sacrificial material on the second piezoelectric substrate;
    forming a beam structure on the sacrificial material and in contact with the wiring layer;
    removing the sacrificial material to form a space between the beam structure and the second piezoelectric substrate; and
    bonding the first piezoelectric substrate to the second piezoelectric substrate by a solder material such that a space is provided between the beam structure and the first piezoelectric substrate,
    wherein the actuator of the MEMS beam is aligned with the beam structure.

* * * * *